(12) United States Patent
Ishinaga

(10) Patent No.: US 6,495,861 B1
(45) Date of Patent: Dec. 17, 2002

(54) LIGHT-EMITTING SEMICONDUCTOR CHIP

(75) Inventor: Hiroki Ishinaga, Kyoto (JP)

(73) Assignee: Rŏhm Co., Ltd., Kyoto (JP)

( * ) Notice: Subject to any disclaimer, the term of this patent is extended or adjusted under 35 U.S.C. 154(b) by 0 days.

(21) Appl. No.: 09/700,247

(22) PCT Filed: Mar. 16, 2000

(86) PCT No.: PCT/JP00/01621
§ 371 (c)(1),
(2), (4) Date: Nov. 9, 2000

(87) PCT Pub. No.: WO00/55926
PCT Pub. Date: Sep. 21, 2000

(30) Foreign Application Priority Data

Mar. 18, 1999 (JP) ............................. 11-73087

(51) Int. Cl.⁷ ............................. H01L 29/76
(52) U.S. Cl. ............................. 257/99
(58) Field of Search ............................. 257/99

(56) References Cited

U.S. PATENT DOCUMENTS 3,593,055 A * 7/1971 Geusic et al.
4,907,044 A * 3/1990 Schellhorn et al.
5,001,609 A * 3/1991 Gardner et al.
5,813,753 A * 9/1998 Vriens et al.
6,274,890 B1 * 8/2001 Oshio et al.

* cited by examiner

Primary Examiner—Stephen D. Meier
(74) Attorney, Agent, or Firm—Gerald T. Bodner

(57) ABSTRACT

A chip-type semiconductor light-emitting device includes a substrate (2). An LED element (1) is mounted on a pad (3a) formed in one (3) of a pair of electrodes (3, 4) formed on the substrate (2). A reflector (6) is formed with an aperture (6c) defined by a slant surface (6Z) and opened to the outside to accommodate therein the LED element (1). Translucent resin is filled in the aperture (6c). The slant surface (6Z) has a plurality of reflection surfaces (P, Q) formed continuous thickness-wise of the reflector, which are selected in inclination angle relative to the substrate (2) such that light is reflected to the immediate upward at respective mid-slopes of the reflection surfaces.

3 Claims, 7 Drawing Sheets

LIGHT-EMITTING SEMICONDUCTOR CHIP

FIELD OF THE INVENTION

This invention relates to chip-type semiconductor light-emitting devices and, more particularly, to a chip-type semiconductor light-emitting device improved in brightness at a center of the radiation surface by the reflector.

PRIOR ART

Conventionally, there have been known a variety of chip-type semiconductor light-emitting devices using light-emitting diode (LED) elements as light-emitting sources. FIG. 11 and FIG. 12 show one example of such devices. FIG. 11 is a plan view showing a state that an LED element is mounted on a substrate. In FIG. 11, a pair of electrodes 3 and 4 are formed of a conductive material on a surface of the substrate 2.

The substrate 2 is formed, at opposite ends, with semi-circular cutouts 2a and 2b on which conductive films, such as plating layers, are formed extending to a backside of the substrate 2 and electrically connected to the pair of electrodes 3 and 4 formed on the surface of the substrate 2. A rectangular pad 3a is formed in one electrode 3 so that an LED element 1 is mounted by die-bonding on the pad 3a. The LED element 1 is electrically connected to the other electrode 4 through wire bonding of a metal wire 5.

An opaque-resin reflector is provided on the substrate 2 mounted with the LED element 1. A translucent resin is filled into an aperture formed in the reflector, thereby forming a chip-type semiconductor light-emitting device. FIG. 12 is a sectional view showing, on a XII—XII section in FIG. 11, a chip-type semiconductor light-emitting device formed as above.

In FIG. 12, 6 is an opaque-resin reflector having a slant surface 6X that is inclined at an acute angle θ1 relative to the substrate 2. An aperture 6a is formed encompassed by the slant surface 6X and opening to an outside. The reflector 6 is formed by injection-molding, for example, a white liquid-crystal polymer.

The reflector 6 is rested on the substrate 2 and then an LED element 1 is mounted in the aperture 6a encompassed by the slant surface 6X and penetrating vertically through thereof. Next, a translucent resin 7, such as an epoxy resin, is filled to encapsulate the LED element 1 and metal wire 5 thus forming a chip-type semiconductor light-emitting device 20. The chip-type semiconductor light-emitting device 20 is to be surface-mounted on a printed-circuit board. Electrical connection is to be made between the conductive films formed in the backside of the substrate 2 through the semicircular cutouts 2a and 2b and a circuit pattern on the printed-circuit board.

By forming the slant surface 6X in the reflector 6, the output light of the LED element 1 is reflected upon the slant surface 6X and radiated toward the front of the chip-type semiconductor light-emitting device 20. Due to this, light emission efficiency is improved in the chip-type semiconductor light-emitting device.

In this example, the aperture 6a of the reflector 6 is formed rectangular as viewed from the above.

FIG. 13 and FIG. 14 show another conventional example of a chip-type semiconductor light-emitting device. FIG. 13 is a schematic perspective view showing, by partial projection. FIG. 14 is a sectional view showing a XIV—XIV section in FIG. 13. The same parts as or corresponding elements to those of FIG. 11 and FIG. 12 are denoted by the same difference numerals. In the FIG. 13 example, cutouts are formed in an elongate-hole form at opposite ends of the substrate 2. The elongate-hole cutouts are formed with conductive films, such as plating layers, extending to the backside of the substrate. The pair of electrodes 3 and 4 are respectively connected to the conductive films.

Inside the reflector 6, a slant surface 6Y is provided inclining at an acute angle θ relative to the substrate 2, to thereby form an inverted-conical aperture 6b that is encompassed by the slant surface 6Y and vertically penetrating through the reflector. In the chip-type semiconductor light-emitting device 30 shown in FIG. 13 and FIG. 14, the output light of the LED element 1 is reflected upon the slant surface 6Y toward the front, improving light emission efficiency. Also, in the example of FIG. 13, the aperture 6b of the reflector 6 is formed circular as viewed from the above.

In this manner, the conventional chip-type semiconductor light-emitting device has a reflector having a slant surface vertically penetrating through the reflector so that the output light of the LED element is reflected by the reflector, thereby improving light emission efficiency.

However, in the conventional chip-type semiconductor light-emitting device, because the angle of the reflector slant surface is set at a constant angle, there is a problem that the output-light center brightness cannot be taken high.

Also, the reflector separately manufactured by injection-molding is attached to the substrate mounted with an LED element. Consequently, where there occurs positional deviation in die-bonding an LED onto the substrate, the LED element and the reflector are impossible to realign with each other, resulting in a problem with center-brightness change.

SUMMARY OF THE INVENTION

Therefore, it is a primary object of the present invention to provide a novel chip-type semiconductor light-emitting device.

Another object of the invention is to provide a chip-type semiconductor light-emitting device capable of improving radiation center brightness.

Another object of the invention is to provide a chip-type semiconductor light-emitting device capable of reducing change or variation in center brightness even if there is positional deviation of the LED element relative to the substrate.

A chip-type semiconductor light-emitting device according to the present invention comprises: a substrate; a semiconductor light-emitting element mounted on the substrate; and a reflector having an aperture having a slant surface in an inner wall thereof and to be rested on the substrate in a manner encompassing the semiconductor light emitting element by the slant surface, the slant surface including first and second reflection surfaces having respective first and second inclination angles and continuing thickness-wise of the reflector but different from each other, the first and second inclination angles being respectively set to reflect light from the semiconductor light-emitting element toward the immediate upward at thickness-wise center regions of the first and second reflection surfaces of the reflector.

The output light from the light-emission center of the semiconductor light-emitting element is reflected by the first reflection surface. At this time, the light reflected at a center region of the first reflection surface travels toward the immediately upward with respect to the surface of the substrate. Similarly, the output light from the light emitting element is reflected by the second surface. The reflection light at a center region of the second reflection surface travels toward immediate upward with respect to the surface of the substrate. Accordingly, the reflection light in the same direction due to a plurality of reflection surface is collected together. This increases the quantity of reflection light travelling toward a center axis of the radiation surface and improves center brightness. Also, because reflection toward the immediate upward can be made at the respective center regions of the first and second reflection surfaces, even if there occur positional deviation upon mounting the semiconductor light emitting element on the substrate, reflection light toward the immediate upward is available in the upper or lower areas of the first reflection surface and/or the second reflection surface with respect to the center area thereof, thereby reducing the variation in center brightness.

Incidentally, in a preferred embodiment, the first reflection surface is formed at a thickness-wise lower side of the reflector and the second reflection surface is formed at a thickness-wise upper side, the second inclination angle being greater as compared to the first inclination angle. If the first inclination angle be set greater than the second inclination angle, no output light reaches the area of the second reflection surface close to the first reflection surface from the semiconductor light emitting element due to blockage by the first reflection surface. This reduces the quantity of the output light reflected by the second reflection surface. Contrary to this, by setting the second inclination angle greater than the first reflection angle, there will not occur such partial shield in the output light hence further improving light emission efficiency.

Incidentally, a shape of the aperture as viewed from above can be selected as an arbitrary form, such as a circular form, a rectangular form or an oval form.

The above described objects and other objects, features, aspects and advantages of the present invention will become more apparent from the following detailed description of the present invention when taken in conjunction with the accompanying drawings.

BEST MODE FOR PRACTICING THE INVENTION

Hereunder, embodiments of the present invention will be explained with reference to the drawings.

Figure 1:
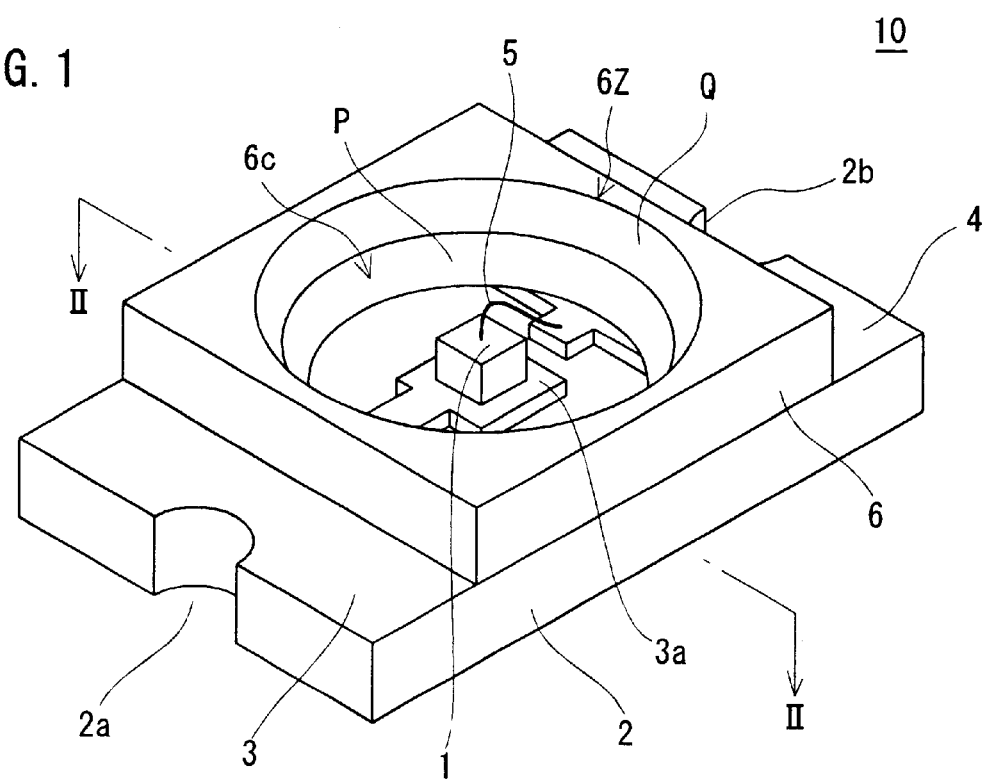
FIG. 1 is a schematic perspective view of a chip-type semiconductor light-emitting device according to one embodiment of the present invention.
Figure 2:
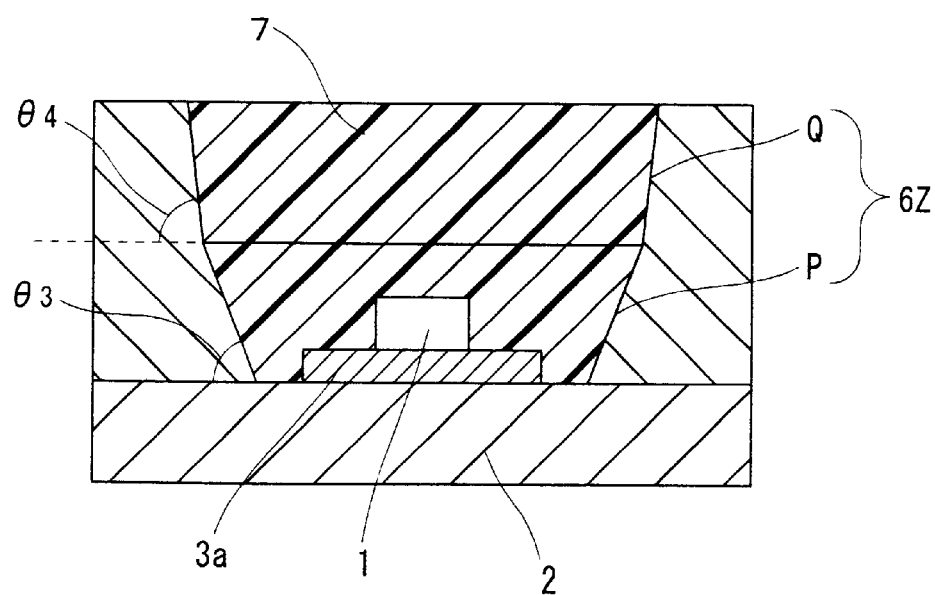
FIG. 2 is a sectional view showing a section as viewed from an arrow II—II.

FIG. 1 is a schematic perspective view showing a chip-type semiconductor light-emitting device according to one embodiment of the invention, and FIG. 2 is a sectional view as viewed on a section B—B in FIG. 1. The same parts as or corresponding elements to those of the conventional chip-type semiconductor light-emitting device shown in FIG. 11 to FIG. 14 are denoted by the same reference numerals, omitting concrete explanations thereof.

In FIG. 1, a reflector 6 formed of an opaque resin has an aperture 6c formed circular as viewed from the above which vertically penetrates through a center portion thereof. The aperture is provided, in its inner wall, with a slant surface 6Z. This slant surface 6Z is plated with metal, such as silver (Ag) or copper-nickel (CuNi) in order to improve the reflection efficiency of output light of the LED element 1. The slant surface 6Z provided in the inner wall of the aperture 6c of the reflector 6 is formed by a plurality of reflection surfaces different in inclination angle relative to the substrate such that the aperture is broadened stepwise in a vertical thickness direction of the reflector 6.

The reflector 6 is rested on the substrate 2 to accommodate the LED element 1 mounted on the substrate 2 in a center of a space surrounded by the slant surface 6Z, as shown by the sectional view of FIG. 2. Next, when a translucent resin 7 is filled in the space of the reflector 6, the translucent resin 7 flows also into a contact surface between the substrate 2 and the reflector 6. This provides adherence of the reflector 6 to the substrate 2 and encapsulation over the LED element 1.

In the example of FIG. 1, the slant surface 6Z is formed by two surfaces, i.e. a first reflection surface P and a second reflection surface Q. As shown in FIG. 2, the lower reflection surface P at the lower side of the slant surface 6Z has a first inclination angle θ3 set at a moderate acute angle with respect to the substrate 2. Also, the reflection surface Q at the upper side continuing the reflection surface P has a second inclination angle θ4 set with respect to the substrate 2 at an acute angle sharper than the inclination angle θ3 of the reflection surface P.

That is, the chip-type semiconductor light-emitting device shown in FIG. 1 has a plurality of reflection surfaces formed as a multi-surfaced slant surface 6Z such that the inclination angle of the reflection surface to the substrate increases as going in a thickness direction of the reflector 6.

Figure 3:
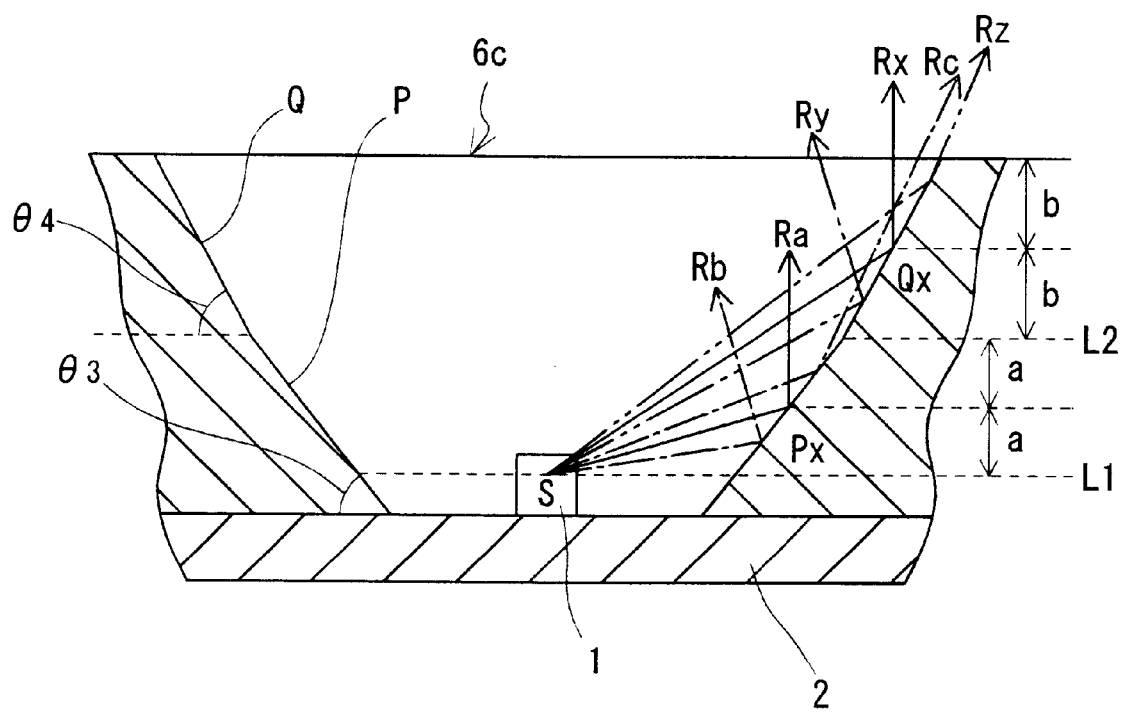
FIG. 3 is a sectional view showing, by partly magnifying, FIG. 2.

Next, the reflection characteristic of output light of the LED element 1 by the slant surface 6Z will be explained with reference to a sectional view of FIG. 3. As shown in FIG. 3, the output light from a light emission center S of a light emission region of the LED element 1 is reflected upon the reflection surface P. The acute inclination angle θ3 of the reflection surface P with respect to the substrate 2 is selected such that the reflection light Ra is reflected at a mid-slope (reflector-6 center region in thickness direction) toward the immediate upward with respect to the surface of the substrate 2.

Here, the mid-slope or center region in the reflection surface P is defined as a position Px where a height on the reflection surface P is given by a=a with reference to a parallel line L1 drawn along the surface of the substrate 2 from a position of a light source S. The reflection light Ra reflected on the lower side of the mid-slope of the reflection surface P is reflected toward a center axis of the light emission region of the LED element 1, i.e. toward an inner side of the aperture 6c. Also, the reflection light Rc reflected on the upper side of the mid-slope of the reflection surface P reflects toward directions of spreading outwardly of the aperture 6c.

Next, explanation will be made on the reflection upon the reflection surface Q formed continuing the reflection surface P. The mid-slope on the reflection surface Q (reflecter-6 center region in thickness direction) is defined by a position Qx where a height on the reflection surface Q is given by b=b with reference to a parallel line L2 drawn parallel with the substrate 2 from a connecting point of between the reflection surface P and the reflection surface Q. Also, the inclination angle θ4 of the reflection surface Q with respect to the substrate 2 is selected greater than the inclination angle θ3 of the reflection surface P to the substrate 2.

The acute inclination angle θ4 of the reflection surface Q with respect to the substrate 2 is selected such that, when the output light from the light-emission center S reflects upon the reflection surface Q, the reflection light Rx at the mid-slope of the reflection surface Q reflects toward the immediate upward with respect to the surface of the substrate 2. The reflection light Ry on the lower side of the mid-slope on the reflection surface Q reflects toward the center axis of the light-emission region of the LED element 1, i.e. toward the inner of the aperture 6c. Also, the reflection light Rz on the upper side of the mid-slope on the reflection surface Q reflects toward directions of spreading outward of the aperture 6c.

In this manner, on the reflection surface P and reflection surface Q, a fan-shape reflection light is provided based on a reflection component, at each of the mid-slopes, toward the immediate upward with respect to the surface of the substrate 2. Also, the output light of the LED element 1 is effectively collected to the reflection surface Q by selecting the inclination angle θ4 of the reflection surface Q with respect to the substrate 2 greater than the inclination angle θ3 of the reflection surface P with respect to the substrate 2.

If the reflection surface P and the reflection surface Q should be selected in their inclination angles as θ4<θ3, no output light reaches to a region of the reflection surface Q near the connection point to the reflection surface P because of blockage by the reflection surface P. This decreases the ratio of output light of the LED element 1 to be collected to the reflection surface Q.

Figure 4:
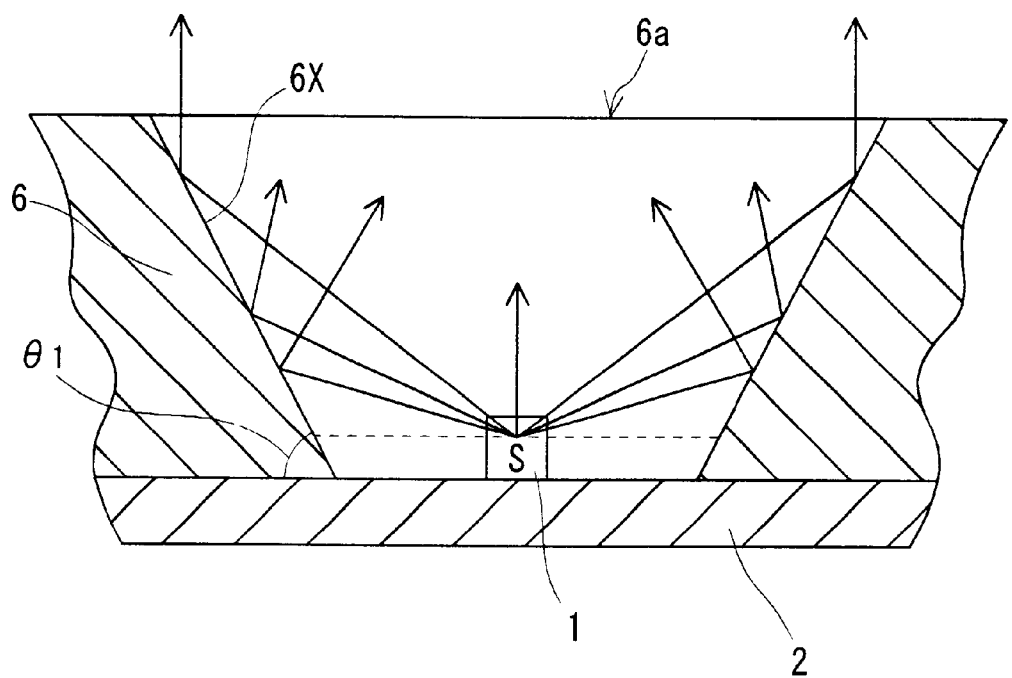
FIG. 4 is a sectional view of a conventional chip-type semiconductor light-emitting device.

Next, explanation will be made on the principle that the chip-type semiconductor light-emitting device of the invention is improved in center brightness in the radiation surface higher than that of the conventional. FIG. 4 is a sectional view, showing on a section A—A in FIG. 11, of the conventional chip-type semiconductor light-emitting device as was explained in FIG. 11 and FIG. 12. In the conventional structure, a single slant surface 6X is provided in the aperture 6a, forming a reflection surface only in one position. The output light of the LED element 1 will reflects evenly over a wide angle upon the reflection surface.

Figure 6:
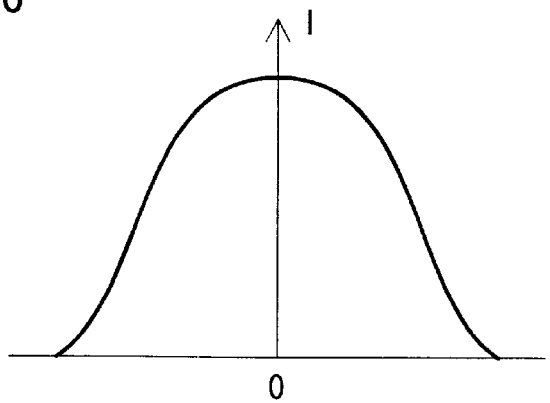
FIG. 6 is a characteristic diagram showing a luminous intensity distribution in the conventional example.

FIG. 6 is a characteristic diagram showing a distribution of luminous intensity I with reference to a center 0 in a radiation surface of the conventional chip-type semiconductor light-emitting device. As shown in FIG. 6, in the conventional chip-type semiconductor light-emitting device, luminous intensity is moderately distributed over the entire range of the radiation surface wherein luminance is not so high at around the center of the radiation surface.

Figure 5:
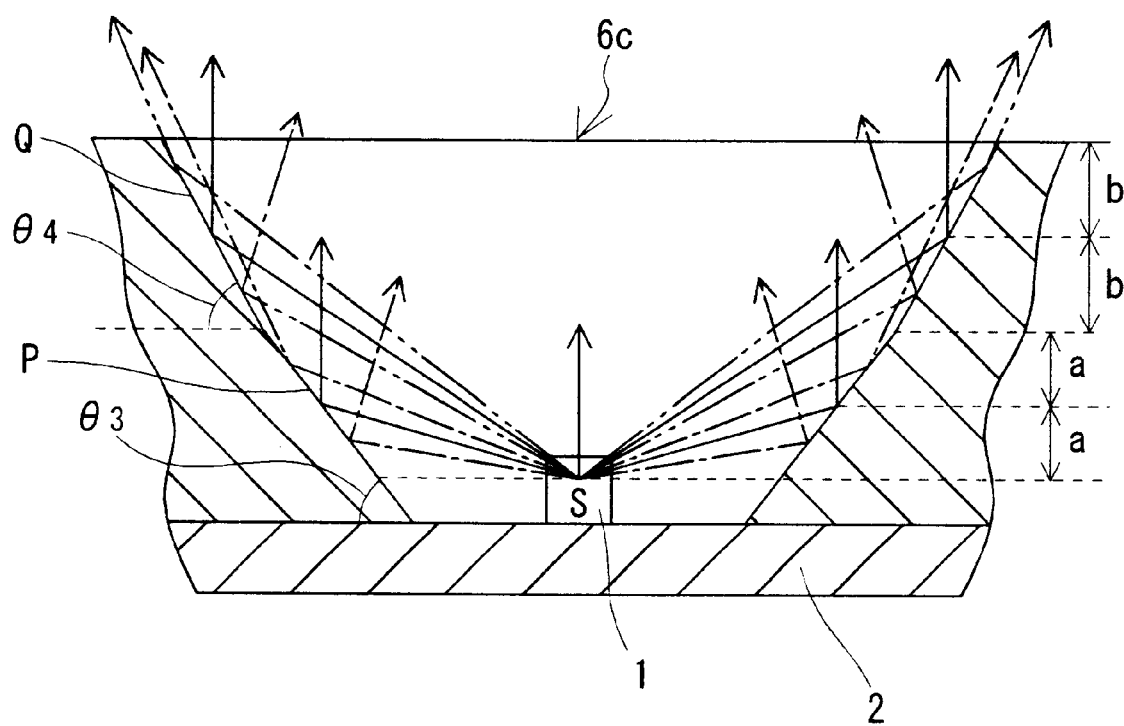
FIG. 5 is a sectional view corresponding to FIG. 3.

FIG. 5 is a sectional view of a chip-type semiconductor light-emitting device of the invention, which corresponds to FIG. 3. In the invention, at least two reflection surfaces are provided continuing one another in a circular reflector aperture as viewed from the above, in positions on an upper side of the light emission region of the LED element to have respective inclination angle selected to direct the reflection light at the mid-slope toward the immediate upward (vertically to the surface of the substrate 2). This provides reflection light components directed toward immediate upward upon the respective reflection surfaces, thereby enhancing brightness at around a center of the radiation surface.

Figure 7:
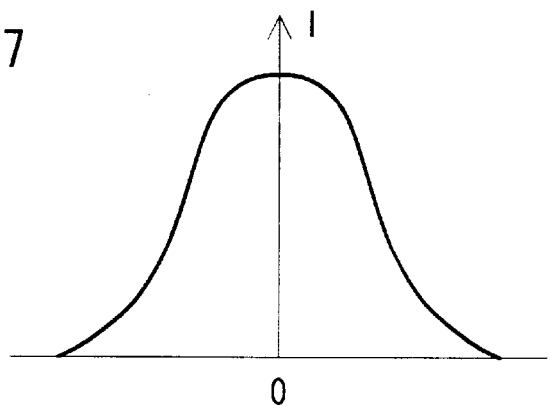
FIG. 7 is a characteristic diagram showing a luminous intensity distribution in the invention.

FIG. 7 is a characteristic diagram showing a distribution of luminance intensity I with reference to the center 0 of the radiation surface of the chip-type semiconductor light-emitting device of the invention. As described above, in this invention, the reflection surface P and the reflection surface Q are joined into a slant surface 6Z with a multi-surfaced reflection surface. Due to this, the reflection light portions due to a plurality of reflection surfaces P and Q are collected together thereby increasing the quantity of the reflection light traveling toward the center axis of the radiation surface of the chip-type semiconductor light-emitting device 10. Accordingly, the luminance intensity is made greater in characteristic at around the center of the radiation surface than the luminance intensity at an peripheral region thereof, when compared to the characteristic of the conventional example of FIG. 6.

Figure 8:
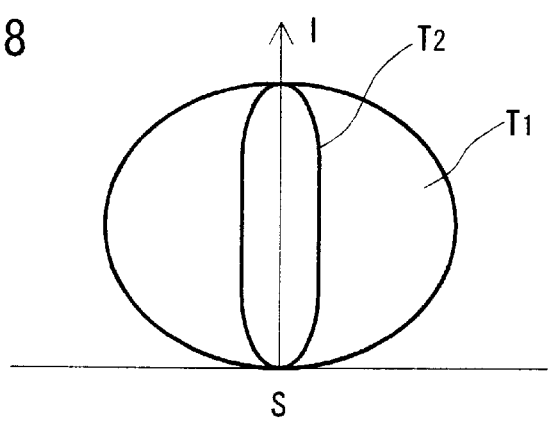
FIG. 8 is a characteristic diagram showing a vertical distribution light curve of a chip-type semiconductor light-emitting device.

FIG. 8 is a characteristic diagram showing a vertical luminance-intensity distribution curve of the chip-type semiconductor light-emitting device. In FIG. 8, S is a light emission center of the light emission region of the LED chip 1 and I is a luminous intensity. A characteristic T1 is by the conventional example and a characteristic T2 is by the instant invention. As apparent from the characteristic of FIG. 8, the chip-type semiconductor light-emitting device of the invention is greatly improved in center brightness.

In the meanwhile, if a plurality of reflection surfaces differing stepwise in inclination angle relative to the substrate are connected one another in the reflector aperture, the length of each reflection surface is shortened, generally resulting in decrease of the probability of obtaining, on the reflection surface, reflection light directed the immediate upward. However, in the invention, the brightness at around the center of the radiation surface is enhanced by selecting the reflection-surface inclination angle to an angle to guide the reflection light toward the immediately upward at the mid-slope.

Also, by forming a slant surface 6Z with a plurality of reflection surfaces P and Q to reflect toward the immediate upward the reflection light reflected at the mid-slope of the reflection surface, it is possible to obtain, on the individual reflection surfaces P and Q, reflection light reflecting toward a center axis of the light-emitting region of the LED element. Accordingly, even if the LED element 1 is deviated in position upon mounting the LED element 1 on the substrate 2, it is possible to obtain reflection light directed toward the immediate upward on the upper reflection surface Q or the lower reflection surface P, thus reducing change or variation in center brightness.

Although the chip-type semiconductor light-emitting device 10 structured shown in FIG. 1 has two reflection surfaces P and Q in connection to form the slant surface 6Z of the reflector 6, a greater number of reflection surfaces may be used in the connection. In this case, the inclination angle of each reflection surface to the substrate is selected to such an angle that reflection light is reflected toward the immediate upward at the mid-slope with reference to a position connecting to the reflection surface. Furthermore, the inclination angle of the lower-side reflection surface close to the substrate is selected smaller than that of the reflection surface connected on the upper side.

Figure 13:
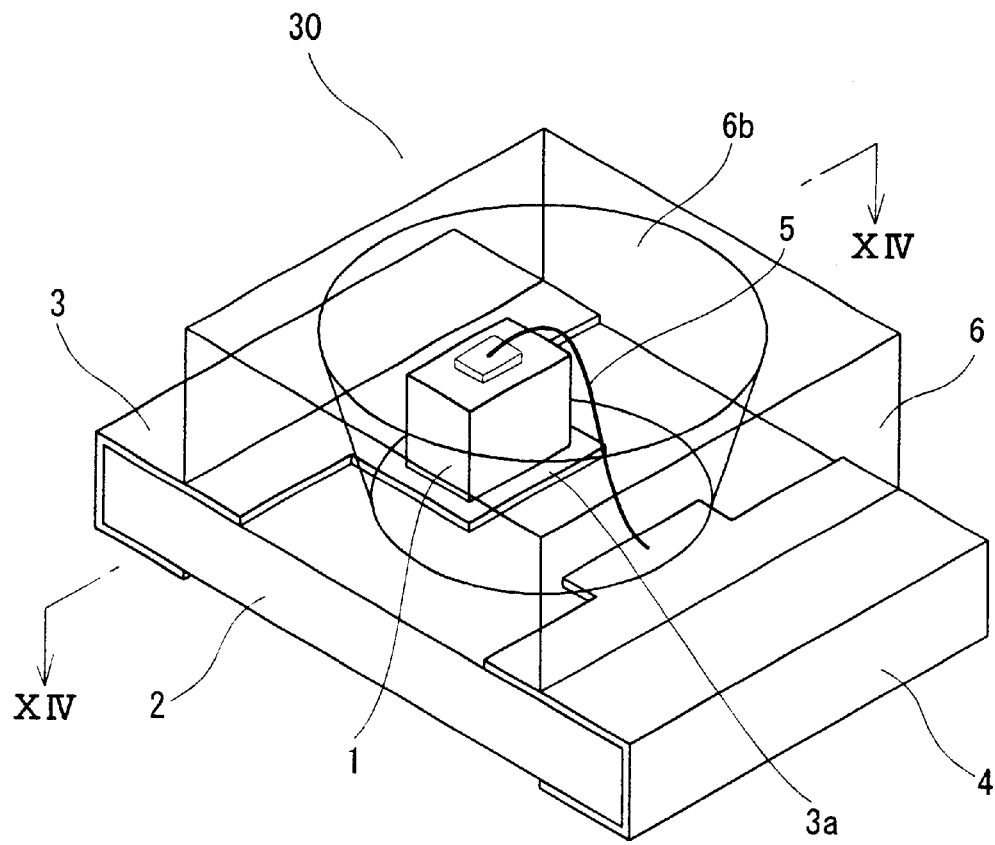
FIG. 13 is a perspective view of the conventional example of a chip-type semiconductor light-emitting device.
Figure 14:
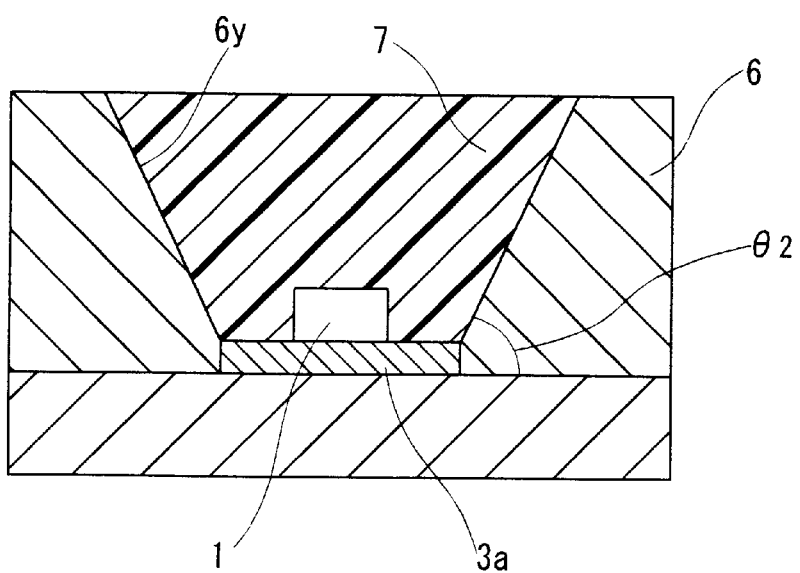
FIG. 14 is an XIV—XIV sectional view in FIG. 13.

Meanwhile, although the end faces of the reflector 6 were selected inner the cutouts 2a, 2b positions formed at opposite ends of the substrate 2, the end faces of the reflector 6 may be aligned to the respective ends of the substrate 2. Furthermore, elongate-holed cutouts may be formed at the opposite ends of the substrate 2 as shown in FIG. 13 so that a pair of electrodes 3 and 4 are connected to conductive films, such as plating layers, formed on the elongate-holed cutouts.

In the example of FIG. 1, because the aperture 6c of the reflector is made circular in shape as viewed from the above, the sectional form in the space 6c is in same shape in every position. The inclination angles θ3 and θ4 of the reflection surface P and Q are selected to reflect reflection light toward the immediate upward at the mid point of the reflection surface as stated before, and wherein a relationship θ4>θ3 is to be given.

Figure 9:
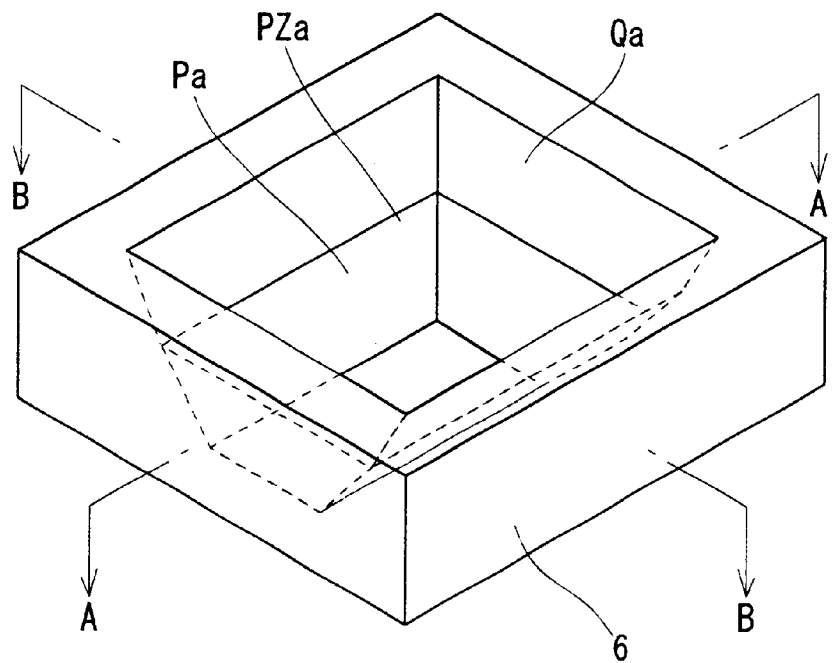
FIG. 9 is a perspective view showing a reflector of another embodiment of the invention.
Figure 10:
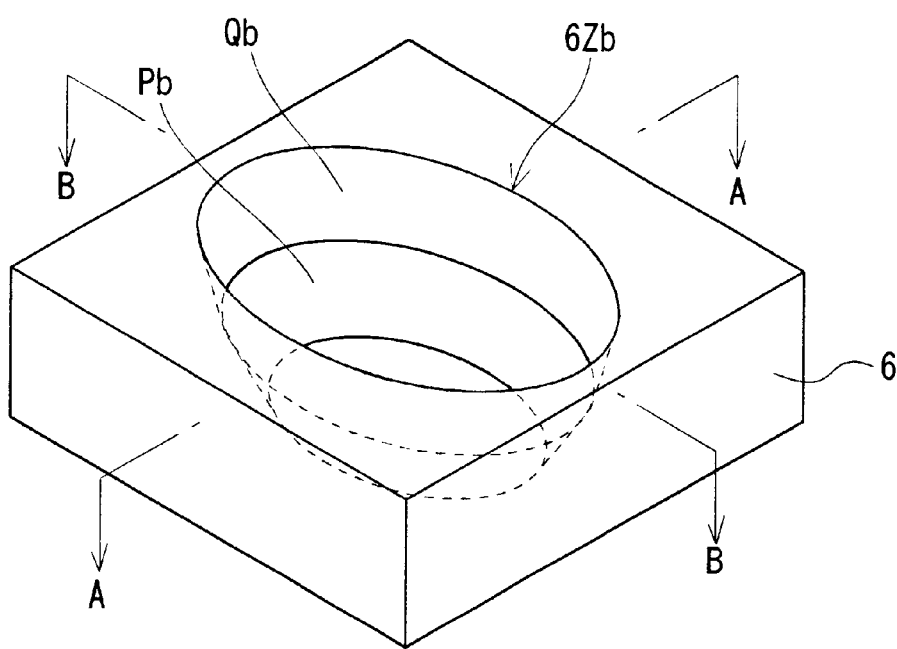
FIG. 10 is a perspective view showing a reflector of still another embodiment of the invention.
Figure 11:
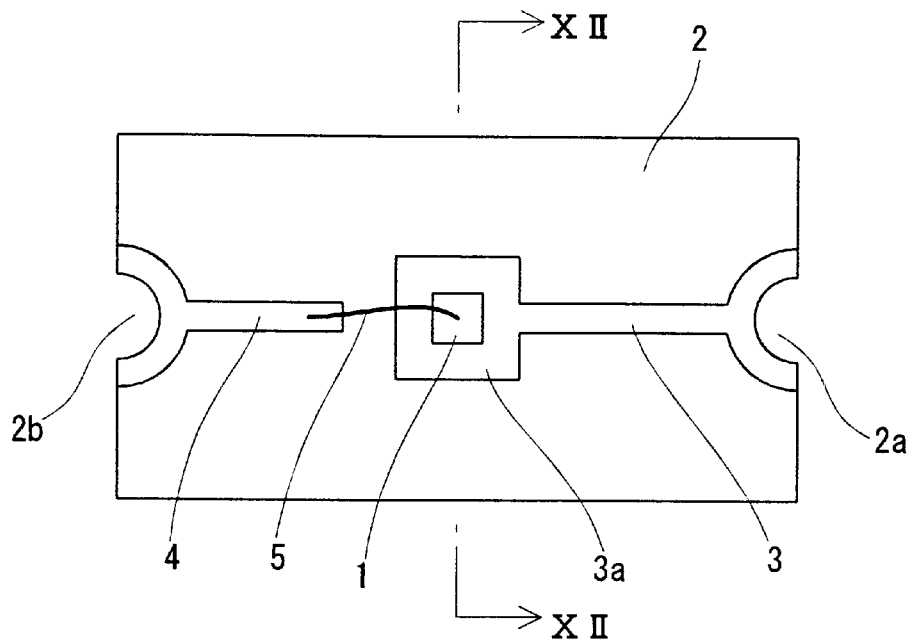
FIG. 11 is a plan view in a state that an LED chip is mounted on a substrate of the conventional chip-type semiconductor light-emitting device.
Figure 12:
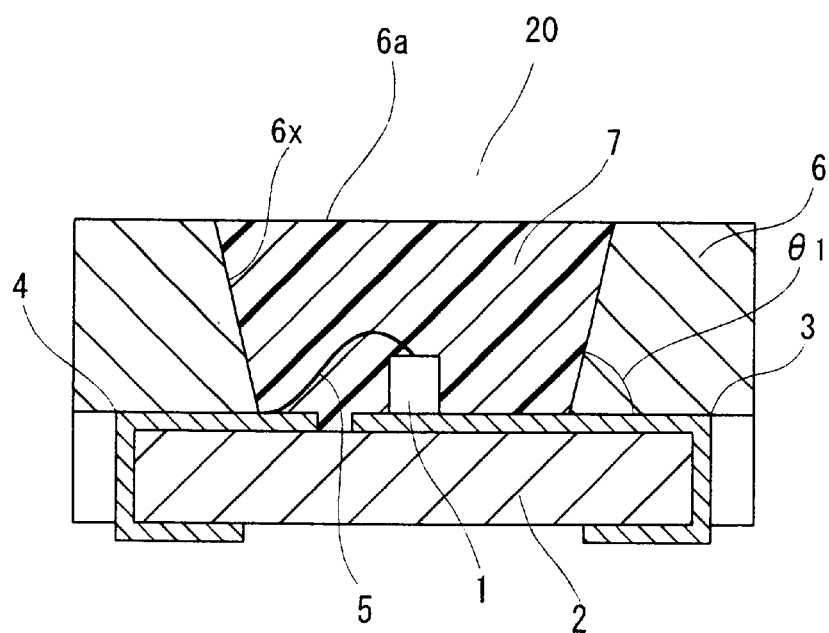
FIG. 12 is an XII—XII sectional view in FIG. 11.

In the chip-type semiconductor light-emitting device of the invention, the aperture of the reflector 6 as viewed from the above, i.e. the form of illumination plane of light outputted from the LED element, can be made in various forms depending upon the application thereof. FIG. 9 is a perspective view of a reflector having an aperture formed rectangular in form as viewed from the above. FIG. 10 is perspective view of a reflector having an aperture formed circular in shape as viewed from the above.

In FIG. 9, the reflector 6 has a vertically-penetrated aperture that is rectangular as viewed from the above. In the aperture, a slant surface 6Za is formed connecting a reflection surface Pa and a reflection surface Qa provided on each side of longer and shorter sides. This slant surface 6Za reflects reflection light, similarly to that of FIG. 3, in each of the sections viewed from the arrow A—A and the arrow B—B.

That is, the reflection surface Pa is selected in inclination angle to the substrate on each of the longer and shorter sides such that the reflection light at a center region of the reflection surface Pa is toward the immediate upward with respect to the surface of the substrate. Also, the reflection surface Qa is selected in inclination angle to the substrate on each of the longer and shorter sides such that the reflection light at a center region of the reflection surface Qa is toward the immediate upward with respect to the surface of the substrate. Incidentally, the inclination angle of the reflection surface Pa relative to the substrate is set smaller than the inclination angle of the reflection surface Qa.

In also the example of FIG. 9, as stated before the reflector slant surface is formed in a multi-surface form in a position of above the light emission region of the LED element, by connecting, on the upper side, at least two or more reflection surfaces different in inclination angle. Each of the reflection surfaces is selected of inclination angle to reflect the light from a light emission center of the LED element toward the immediate upward of a center area of the reflection surface, hence improving radiation-surface center brightness.

Also, even if positional deviation occurs upon mounting the LED element onto the substrate, up-directed reflection light is available in the upper and lower reflection surfaces, thereby making possible to reduce center-brightness variation.

Next, in an example of FIG. 10, a reflector 6 has a vertically-penetrated aperture oval in form as viewed from the above. In the aperture, a slant surface 6Zb is formed by connecting with a reflection surface Pb and a reflection surface Qb on each of the longer and shorter sides. The reflector 6 is rested on the substrate such that an LED is surrounded in a center by the slant surface 6Zb.

In also this slant surface 6Zb, the reflection surfaces are selected in inclination angle, on each of the longer and shorter sides, such that the reflection light at a mid-slope of the reflection surface is toward the immediate upward with respect to the surface of the substrate, in each of the sections on the arrow A—A and the arrow B—B. That is, the reflection-surface inclination angle is selected such that the light from the light emission center of the LED element is reflected at the mid-slope corresponding to each of the shorter and longer sides. Also, the inclination angle of the reflection surface Pb with respect to the substrate is set smaller than the inclination angle of the reflection surface Qb.

In this manner, in also the example of FIG. 10, the reflector slant surface is formed in multi-surface form positions above the light emission region of the LED element and by connecting, on the upper side, at least two or more reflection surfaces different in inclination angle. The reflection surfaces have respective inclination angles selected to reflect toward the immediate upward the light from the light emission center of the LED element at the mid-slope corresponding to each of the shorter and longer sides of the reflection surface as viewed from the above. This makes possible to improve radiation-surface center brightness. Also, even if positional deviation occur upon mounting the LED element onto the substrate, upward-directed reflection light is available in the upper and lower reflection surfaces, thereby reducing variation in center brightness.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A chip-type semiconductor light-emitting device, comprising:

a substrate;

a semiconductor light-emitting element mounted on said substrate; and a reflector having an aperture having a slant surface in an inner wall thereof and to be rested on said substrate in a manner encompassing said semiconductor light emitting element by said slant surface, said slant surface including first and second reflection surfaces having respective first and second inclination angles and continuing thickness-wise of said reflector but different from each other, said first and second inclination angles being respectively set to reflect light from said semiconductor light-emitting element in a direction perpendicular to said substrate at thickness-wise center regions of said first and second reflection surfaces of said reflector.

2. A chip-type semiconductor light-emitting device according to claim 1, wherein said first reflection surface is formed at a thickness-wise lower side of said reflector and said second reflection surface is formed at a thickness-wise upper side, said second inclination angle being greater as compared to said first inclination angle.

3. A chip-type semiconductor light-emitting device according to claim 2, wherein a shape of said aperture as viewed from above is one selected from a circular form, a rectangular form and an oval form.

* * * * *